(12) United States Patent
Bleeker (10) Patent No.: US 7,141,340 B2
(45) Date of Patent: Nov. 28, 2006

(54) LITHOGRAPHIC APPARATUS, PROGRAMMABLE PATTERNING STRUCTURE, DEVICE MANUFACTURING METHOD, AND DEVICE MANUFACTURED THEREBY

(75) Inventor: Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 258 days.

(21) Appl. No.: 10/721,789

(22) Filed: Nov. 26, 2003

(65) Prior Publication Data

US 2004/0145712 A1    Jul. 29, 2004

(30) Foreign Application Priority Data

Nov. 27, 2002    (EP) .................................. 02258163

(51) Int. Cl.
*G03F 1/00* (2006.01)
*G09G 3/04* (2006.01)
*G03B 27/42* (2006.01)

(52) U.S. Cl. ..................... 430/5; 250/492.22; 345/43; 345/33; 355/53

(58) Field of Classification Search ..................... None
See application file for complete search history.

(56) References Cited

U.S. PATENT DOCUMENTS

| | | | |
|---|---|---|---|
| 5,682,214 A | 10/1997 | Amako et al. ................ 349/74 |
| 5,998,069 A | 12/1999 | Cutter et al. .................... 430/5 |
| 6,261,728 B1 | 7/2001 | Lin ............................. 430/30 |
| 2002/0112824 A1* | 8/2002 | Ballard et al. .............. 156/581 |
| 2003/0076423 A1* | 4/2003 | Dolgoff .................... 348/222.1 |

FOREIGN PATENT DOCUMENTS

| | | |
|---|---|---|
| EP | 0 451 681 A2 | 4/1991 |
| EP | 0 451 681 A3 | 4/1991 |
| JP | 2001194626 | 7/2001 |

OTHER PUBLICATIONS

European Search Report dated Jun. 2, 2004.
Seok-Whan Chung et al., "Design and fabrication of 10×10 micro-spatial light modulator array for phase and amplitude modulation," *Sensors and Actuators* (1999), pp. 63-70.
European Search Report dated Aug. 22, 2003.

\* cited by examiner

*Primary Examiner*—John A. McPherson
*Assistant Examiner*—Daborah Chacko-Davis
(74) *Attorney, Agent, or Firm*—Pillsbury Winthrop Shaw Pittman, LLP (57) ABSTRACT

Pixel element for a programmable patterning structure (e.g. a spatial light modulator) which can simultaneously modulate both phase and amplitude. Use of such a programmable patterning structure with lithographic projection apparatus is also described.

28 Claims, 3 Drawing Sheets

LITHOGRAPHIC APPARATUS, PROGRAMMABLE PATTERNING STRUCTURE, DEVICE MANUFACTURING METHOD, AND DEVICE MANUFACTURED THEREBY

RELATED APPLICATIONS

This application claims priority to European Patent Application EP 02258163.1, filed Nov. 27, 2002, which document is herein incorporated by reference.

FIELD OF THE INVENTION

The present invention relates to programmable patterning structures and lithographic projection apparatus and methods.

BACKGROUND

The term "programmable patterning structure" as here employed should be broadly interpreted as referring to any configurable or programmable structure or field that may be used to endow an incoming radiation beam with a patterned cross-section, corresponding to a pattern that is desired to be created in a target portion of a substrate; the terms "light valve" and "spatial light modulator" (SLM) can also be used in this context. Generally, such a pattern will correspond to a particular functional layer in a device being created in the target portion, such as an integrated circuit or other device (see below). Examples of such patterning structure include:

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193 and PCT patent applications WO 98/38597 and WO 98/33096, which documents are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

It should be appreciated that where pre-biasing of features, optical proximity correction features, phase variation techniques, and/or multiple exposure techniques are used, the pattern "displayed" on the programmable patterning structure may differ substantially from the pattern eventually transferred to the substrate or layer thereof.

Lithographic projection apparatus can be used, for example, in the manufacture of integrated circuits (ICs), flat panel displays, and other devices involving fine structures. In such a case, the programmable patterning structure may generate a circuit pattern corresponding to an individual layer of, for example, the IC, and this pattern can be imaged onto a target portion (e.g. comprising one or more dies and/or portion(s) thereof) on a substrate (e.g. a glass plate or a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

The lithographic projection apparatus may be of a type commonly referred to as a step-and-scan apparatus. In such an apparatus, each target portion may be irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemomechanical polishing, etc., each of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, catadioptric systems, and micro lens arrays, for example. It is to be understood that the term "projection system" as used in this application simply refers to any system for transferring the patterned beam from the programmable patterning structure to the substrate. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion beams or electron beams).

In presently known lithographic projection apparatus using programmable patterning structure, the substrate table is scanned in the path of the patterned projection beam (e.g. below the programmable patterning structure). A pattern is set on the programmable patterning structure and is then exposed on the substrate during a pulse of the radiation system. In the interval before the next pulse of the radiation system, the substrate table moves the substrate to a position as required to expose the next target portion of the substrate (which may include all or part of the previous target portion), and the pattern on the programmable patterning structure is updated if necessary. This process may be repeated until a complete line (e.g. row of target portions) on the substrate has been scanned, whereupon a new line is started.

In order to optimise the pattern projected onto a substrate using a lithographic projection apparatus, it is desirable to be able to produce gray scale exposures. It is also desirable to be able to create a phase difference between adjacent elements. For example, such characteristics may be used to enable closer control of the position of the edges of features produced on the substrate. Presently known spatial light modulators can produce gray scale images. Other presently known spatial light modulators can produce phase modulation. However, it would be desirable to form spatial light modulators with even greater control of the image produced.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display (LCD) panels, thin-film magnetic heads, thin-film-transistor (TFT) LCD panels, printed circuit boards (PCBs), DNA analysis devices, etc. The skilled artisan will appreciate that, in the context of such alternative applications, any use of the terms "wafer" or "die" in this text should be considered as being replaced by the more general terms "substrate" and "target portion", respectively.

SUMMARY

A programmable patterning structure according to one embodiment of the invention includes a plurality of individually addressable pixel elements. At least one of these pixel elements includes a layer of electro-optical material having a birefringence that varies according to an applied voltage, and a plurality of electrodes. The electrodes are configured to apply a voltage to the layer sufficient to vary the birefringence of the electro-optical material. Each of the plurality of pixel elements is selectively configurable to modulate both of an amplitude and a phase of radiation that is incident on the pixel element. Apparatus including such structure and related methods are also described.

BRIEF DESCRIPTION OF THE DRAWINGS

Exemplary embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, programmable patterning structures providing enhanced control of the images that they produce, apparatus including such structures, and methods including use of such structures.

Figure 1:
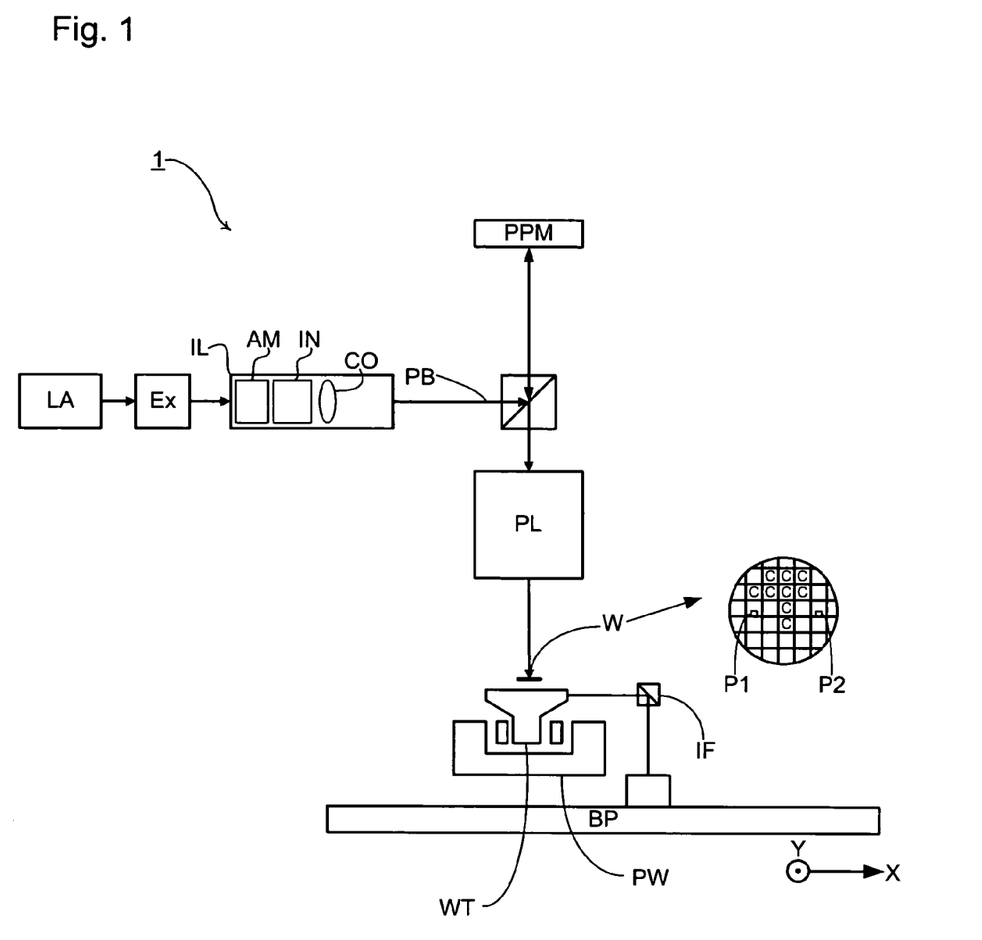
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A programmable patterning structure PPM (e.g. a programmable mirror array) configured to apply a pattern to the projection beam. In general, the position of the programmable patterning structure will be fixed relative to item PL. However, it may instead be connected to a positioning structure configured to accurately position it with respect to item PL;

An object table (substrate table) configured to hold a substrate. In this example, substrate table WT is provided with a substrate holder for holding a substrate W (e.g. a resist-coated semiconductor wafer) and is connected to a positioning structure for accurately positioning the substrate with respect to item PL and (e.g. interferometric) measurement structure IF, which is configured to accurately indicate the position of the substrate and/or substrate table with respect to lens PL; and A projection system ("lens") PL (e.g. a quartz and/or $CaF_2$ lens system, a catadioptric system comprising lens elements made from such materials, and/or a mirror system) configured to project the patterned beam onto a target portion C (e.g. comprising one or more dies and/or portion(s) thereof) of the substrate W. The projection system may project an image of the programmable patterning structure onto the substrate; alternatively, the projection system may project images of secondary sources for which the elements of the programmable patterning structure act as shutters. The projection system may also comprise a micro lens array (MLA), e.g. to form the secondary sources and to project microspots onto the substrate.

As here depicted, the apparatus is of a reflective type (e.g. has a reflective programmable patterning structure). However, in general, it may also be of a transmissive type (e.g. with a transmissive programmable patterning structure) or have aspects of both types.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the programmable patterning structure PPM, which may be held on a mask table. Having been selectively reflected by (alternatively, having traversed) the programmable patterning structure PPM, the beam PB passes through the lens PL, which focuses the beam PB onto a target portion C of the substrate W. With the aid of the positioning structure (and interferometric measuring structure IF), the substrate table WT can be moved accurately, e.g. so as to position different target portions C in the path of the beam PB. Where used, a positioning structure for the programmable patterning structure PPM can be used to accurately position the programmable patterning structure PPM with respect to the path of the beam PB (e.g. after a placement of the programmable patterning structure PPM, between scans, and/or during a scan).

In general, movement of the object table WT may be realized with the aid of a long-stroke module (e.g. for coarse positioning) and a short-stroke module (e.g. for fine positioning), which are not explicitly depicted in FIG. 1. A similar system may be used to position the programmable patterning structure PPM. It will be appreciated that, to provide the required relative movement, the projection beam may alternatively or additionally be moveable, while the object table and/or the programmable patterning structure PPM may have a fixed position. Programmable patterning structure PPM and substrate W may be aligned using substrate alignment marks P1, P2 (possibly in conjunction with alignment marks of the programmable patterning structure PPM).

The depicted apparatus can be used in several different modes. In a step mode, the entire pattern on the programmable patterning structure may be projected at one time (i.e. in a single "flash") onto a target portion C. The substrate table WT may then be moved in the x and/or y directions to a different position for a different target portion C to be irradiated by the beam.

A scan mode is essentially the same as the step mode, except that a given target portion C is not exposed in a single "flash". Instead, the programmable patterning structure is movable in a given direction (the so-called "scan direction", e.g. the y direction) with a speed v, so that the projection beam PB is caused to scan over the programmable patterning structure. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In a pulse mode, the programmable patterning structure is kept essentially stationary, and the substrate table WT is moved or scanned while a pattern imparted to the projection beam is projected onto a target portion C (e.g. using a pulsed radiation source). The substrate table WT is moved with an essentially constant speed such that the projection beam PB is caused to scan a line across the substrate W. The pattern on the programmable patterning means is updated as required between pulses of the radiation system and/or after each movement of the substrate table WT, and the pulses may be timed such that successive target portions C are exposed at the required locations on the substrate. Consequently, the projection beam can scan across the substrate W to expose the complete pattern for a strip of the substrate. The process is repeated until the complete substrate has been exposed line by line. This mode of operation can be readily applied to maskless lithography that utilizes programmable patterning structure, such as a programmable mirror array of a type as referred to above.

The apparatus may also be used in a continuous scan mode, which is essentially the same as the pulse mode except that a substantially constant radiation source is used, and the pattern on the programmable patterning structure is updated as the projection beam scans across the substrate and exposes it.

Combinations and/or variations on the above-described modes of use or entirely different modes of use may also be employed.

Figure 2:
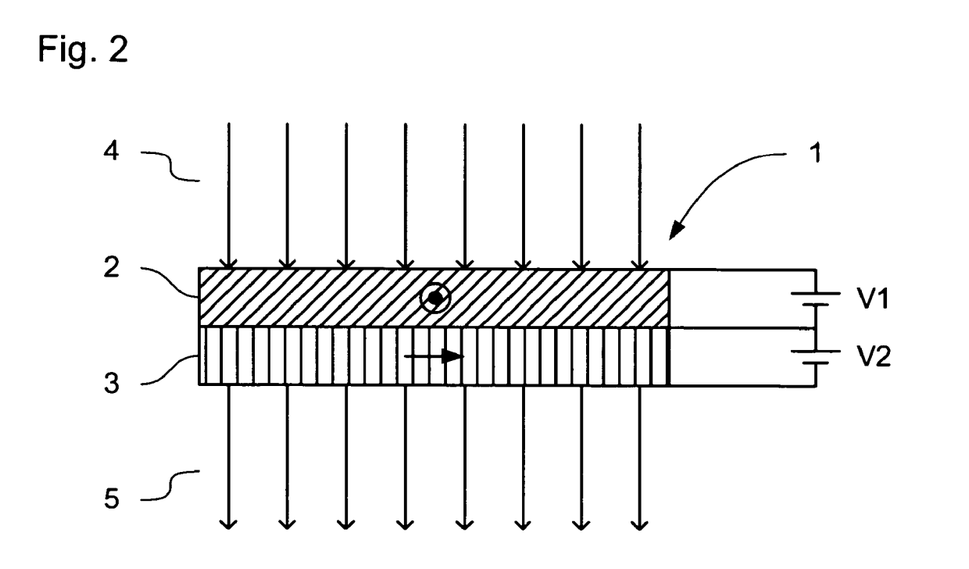
FIG. 2 depicts a pixel element of a programmable patterning structure according to another embodiment of the present invention.

FIG. 2 shows a pixel element 1 for use in an SLM according to an embodiment of the present invention. In general, the SLM will be comprised of an array of such pixel elements. The array may, for example, contain between 1 and 8 million pixels, each between 5 and 10 microns (μm) across. The pixel element 1 is comprised of a first layer of electro-optical material 2 and a second layer of electro-optical material 3. It may be desirable for the first layer to be attached to the second layer; alternatively, a gap (vacuum, or filled with air or another gas) or one or more other layers may be disposed therebetween.

The layers of electro-optical material 2, 3 function as uniaxial birefringent materials (with three orthogonal axes: two "ordinary" axes, in which the refractive index is a first value; and an "extraordinary" axis, sometimes referred to as the "optical axis", in which the refractive index is a second, different, value). Each layer of electro-optical material 2, 3 may be oriented such that one of the ordinary axes is parallel to the optical axis of the lithographic apparatus (e.g. parallel to the direction of the radiation incident on the SLM in the situation shown in FIG. 2). It will be appreciated, however, that, in some applications, the incident radiation may not be telecentric, in which case the incident radiation may not be parallel to the optical axis of the lithographic apparatus. As shown in FIG. 2, the layers of electro-optical material 2, 3 are oriented such that the extraordinary axis of the first layer of electro-optical material 2 is perpendicular to the extraordinary axis of the second layer of electro-optical material 3.

Each of the layers of electro-optical material is provided with electrodes by which a voltage can be applied to the material. Voltage applied to the first layer 2 is designated V1, and the voltage applied to the second layer 3 is designated V2. The voltage V1, V2 applied to each layer can be independently controlled.

The birefringence of the electro-optical layers 2, 3 is dependent on the voltage V1, V2, respectively, applied to each of the layers. Since the extraordinary axis of the two layers 2, 3 are mutually perpendicular, the ordinary ray (O-ray) in the first layer 2 becomes the extra-ordinary ray (E-ray) in the second layer 3 and vice versa. The birefringence of the materials causes the extra-ordinary ray to lag (or lead) with respect to the ordinary ray. The magnitude of the difference is dependent on the birefringence which, in turn, is dependent on the voltage applied.

On the exit plane, therefore, there exists a phase difference between the ordinary rays and the extra-ordinary rays. This phase difference depends on the applied voltage, and it results in a change in polarization. In the second layer 3, the role of the ordinary and extra-ordinary rays are exchanged. Therefore, if desired, a compensation of polarization change can take place. For example, if voltages V1, V2 suitable to produce equivalent changes in birefringence of the layers 2, 3 are applied, then the net change in polarization will be negligible (depending on e.g. the relative thicknesses and component materials of the two layers, such V1, V2 may or may not be the same, although it may be desirable for the two layers to have substantially the same thickness and composition). However, the resultant beam of radiation will have an overall phase change as compared to a beam outgoing from a pixel element in which no voltage is applied to either layer. Therefore, by applying suitable (e.g. equal) voltages to both layers of a first pixel element and applying no voltage to either layer of an adjacent pixel element, the resultant radiation from the two pixel elements will not have any difference in polarization, but there will be a phase difference between the two. By applying a voltage to one layer but not the other, a change in polarization of the beam of radiation may be achieved.

The phase change of the beam of radiation is dependent on the total voltage applied to both layers. Therefore, by independently controlling the voltage applied to each layer, the pixel element 1 can be used to control both the phase of the beam of radiation and the change in polarization. An offset voltage may be applied to both layers 2, 3. By increasing the voltage on one layer and decreasing the voltage on the other layer, the resultant beam of radiation from the pixel element may be controlled to have the same phase as a beam of radiation from a pixel element with the offset voltages applied, but the polarization of the beam of radiation will have been altered.

The radiation 4 incident on the pixel element 1 may be polarized, either inherently as a result of the radiation system or by providing a polarizing filter between the radiation system and the SLM. The radiation 5 emitted from the pixel element 1 may also be polarized, but with the angle of the polarization being shifted by an amount dependent on e.g. the difference between the voltages V1, V2 applied to the electro-optical layers 2, 3. A second polarizing filter may be located between the SLM and the substrate onto which the radiation is projected. This polarizing filter may be used to attenuate the intensity of the radiation by an amount that depends on the shift in polarization of the output beam of radiation 5. Therefore, by varying the degree of polarization shift within each pixel element, gray scales can be produced. In summary, by adjusting two voltages for each pixel element, each pixel element may perform phase and amplitude modulation at the same time.

Figure 3:
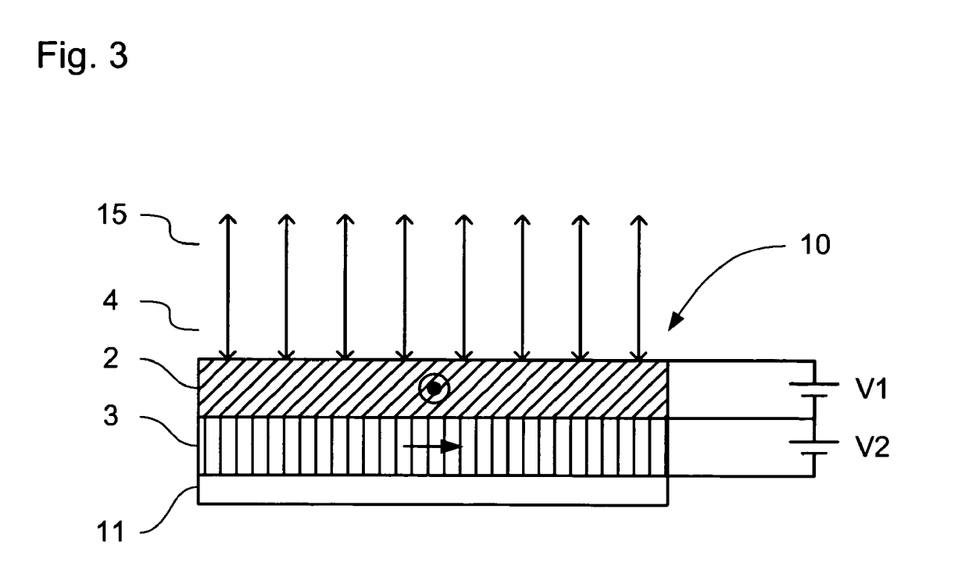
FIG. 3 depicts a variant of the structure shown in FIG. 2.

FIG. 3 shows a variant of the embodiment shown in FIG. 2 which includes a reflective layer 11. It may be desirable for the reflective layer 11 to be attached to the second electro-optical layer 3; alternatively, a gap (vacuum, or filled with air or another gas) or one or more other layers may be disposed therebetween. The reflective layer 11 reflects the incident beam of radiation 4 back through the electro-optical layer, thus forming a reflective SLM which may be used in situations where it is not appropriate to use a transmissive SLM as shown in FIG. 2. Since the light passes through the electro-optical layers twice, the shift in amplitude and polarization provided by the electro-optical layer is, in effect, doubled. Consequently a smaller voltage may be applied to each of the layers to attain the same effect and/or the layers of electro-optical material can be thinner.

The efficiency of this variant of the embodiment shown in FIG. 2 can be improved by providing an anti-reflection coating on the top face of the first electro-optical layer 2 and/or by providing a reflection enhancement coating between the reflected surface 11 and the second electro-optical layer 3.

The electro-optical layers may be formed from one or more of any well-known opto-electric materials, such as ADP (ammonium dihydrogen phosphate), AD*P (deuterated ADP), KDP (potassium dihydrogen phosphate), and KD*P (deuterated KDP). In order to obtain the best response from the electro-optical materials they should preferably be operated close to, but above, the Curie temperature of the material(s) used. These generally are lower than ambient temperatures. KDP, for example, has a Curie temperature of 123 K, KD*P has a Curie temperature variously reported as 213 or 222 K, and ADP has a Curie temperature of 148 K. Consequently, a temperature-controlled cooling unit (not shown) may be provided to cool the electro-optical layers.

For example, cooling may be applied by means of a cooling element in thermal contact with the electro-optical layers or by directing a flow of cooling gas onto the electro-optical layers.

At least one of the pixel elements comprises a layer of electro-optical material and electrodes for selectively applying a voltage to the electro-optical material in order to change its birefringence. The birefringence of the material causes the polarization of radiation passing through it to change. The degree of change of the polarization is dependent on the birefringence of the material which, in turn, is dependent on the voltage applied to the electro-optical material. Therefore, by illuminating the programmable patterning structure with polarized light, and passing the light emitted from the programmable patterning structure through a polarizing filter prior to it being projected onto the substrate, the amplitude of the light from each pixel may be modulated.

The pixel element may contain a second layer of electro-optical material with electrodes for applying a second voltage to the second electro-optical material layer in order to change its birefringence. It may be desirable for the direction of the extraordinary axis of the second layer to be perpendicular to the direction of the extraordinary axis of the first layer of electro-optical material, while the directions of the ordinary axes of both layers are generally parallel to the beam of radiation that is incident on the programmable patterning structure.

Assuming that the two layers have substantially equivalent birefringence-voltage dependences, if the voltage applied to the first and second layers is the same, then the second layer of electro-optical material will compensate for the change in polarization of the first electro-optical layer, while any difference between the voltages applied to the first and second electro-optical material layer will result in a net change of polarization of the beam of radiation emitted from the pixel with respect to the beam of radiation incident upon it. Therefore, by use of an appropriate polarizing filter, the radiation can be amplitude-modulated by the pixel element.

The birefringence of the electro-optical layer also results in a phase change of the radiation. However, the phase change produced by the two layers is cumulative, such that the phase change produced by one layer does not compensate for the phase change produced by the other layer. Therefore the pixel element may also be used to phase modulate the beam of radiation. When little or no voltage is applied to both layers, there is effectively no phase change to the radiation and no change in polarization. If voltage is applied to one of the two layers, the phase and the polarization of the beam of radiation is changed. If voltage is applied to both layers, then the phase of the radiation will be changed but the polarization will not change. It is therefore possible to modulate the phase and amplitude of the radiation independently.

Figure 4:
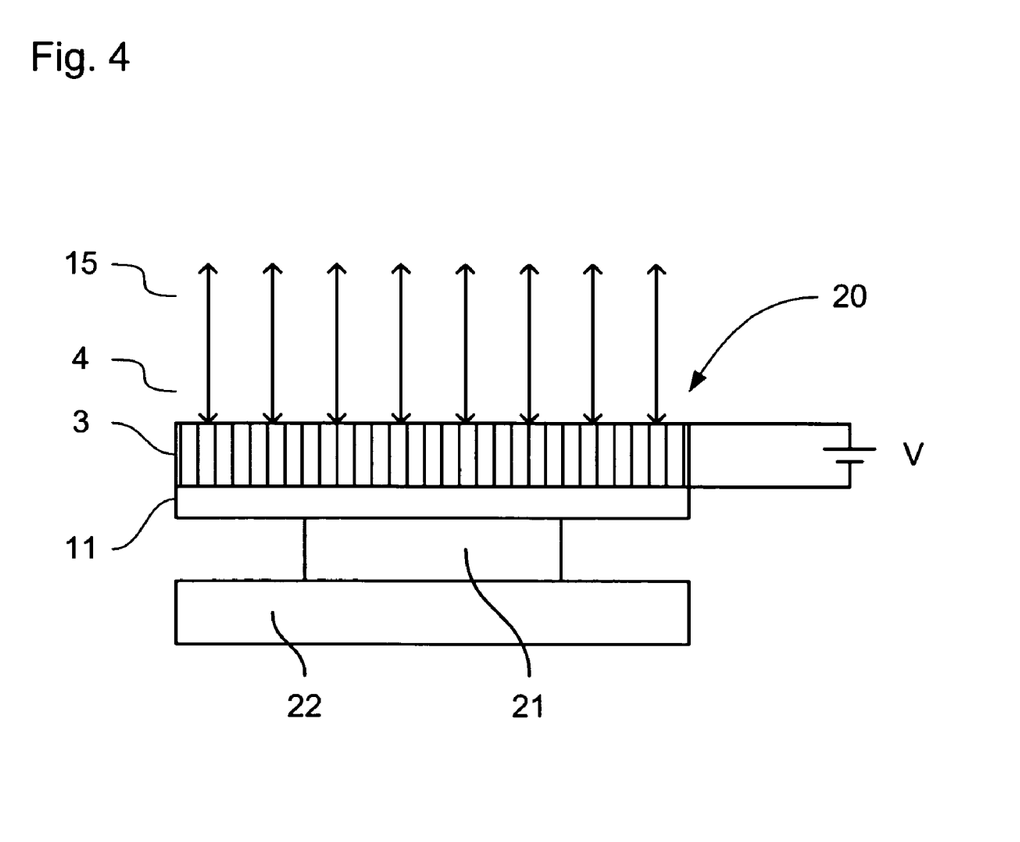
FIG. 4 depicts a pixel element from a programmable patterning structure according to another embodiment of the present invention.

FIG. 4 shows a pixel element 20 that may be used in an SLM for a lithographic projection apparatus according to the second embodiment of the invention. A single electro-optical layer 3 is provided. Electrodes attached to the layer are used to provide a voltage V to this layer. A reflective surface 11 is attached to the electro-optical layer 3.

As in a structure according to the first embodiment, a beam of radiation 4 is incident upon the pixel element 20, traverses the electro-optical layer 3, is reflected by the reflective layer 11, re-traverses the electro-optical layer 3 and is emitted from the pixel element as a beam of radiation 15. The voltage V applied to the electro-optical layer 3 may be used to adjust the shift in polarization of the beam of radiation. Again, by using a polarizing filter, control of the polarizing shift can be used to effect gray scaling.

The electro-optical layer 3 and the reflective layer 11 are mounted on an actuator 21 which is controlled by electrodes 22. The actuator 21 may, for example, be effected using piezoelectric and/or electrostatic effects. The actuator 21 is used to control the position of the electro-optical layer 3 and the reflective layer 11 in a direction generally parallel to the incident beam of radiation (although when the beam is non-telecentric, the movement may be at a nonzero angle to the direction of the beam of radiation). By adjusting the position of the electro-optical layer 3 and the reflective layer 11, the length of the beam path is altered, thereby allowing control of the phase of the radiation emitted from the pixel element. This control may be used to produce a phase difference between the radiation emitted by adjacent pixels. It should be noted that since the variation in the birefringence of the electro-optical layer 3 caused by the changing of the voltage V will also induce a phase shift in the beam, it may be desirable to use the actuator 21 to compensate for the phase shift induced by the electro-optical layer 3 in order to produce independent control of the phase and amplitude of the radiation outgoing from the pixel element 20.

In a structure according to this embodiment, the pixel element comprises a single layer of electro-optical material for adjusting the polarization of the radiation, and hence amplitude modulating the radiation. This layer is mounted on an actuator for adjusting the position of the pixel element in a direction parallel to the beam of radiation incident on it. Adjusting the position of the layer can therefore be used to phase modulate the radiation.

The electro-optical materials which are used in the present invention have some similar properties to liquid crystal devices used in displays commonly referred to as LCDs. However, the electro-optical materials are in a solid state rather than liquid. Potential advantages of such electro-optical materials include reduced degradation in the presence of UV and DUV radiation as compared to liquid crystals; switching to a different state at a much faster rate than liquid crystals (potentially at GHz rate, whereas liquid crystal devices can typically only switch at rates of up to 4 kHz); and/or that devices made from electro-optical material can be manufactured using lithography techniques, such that electro-optical devices can therefore be potentially made in much smaller sizes than corresponding liquid crystal devices. However, the invention also includes embodiments that may not have one or more such advantages.

A lithographic apparatus with a programmable patterning structure as described herein may be used to produce devices on a substrate having features with edges that are more closely controlled. Consequently, the quality of the features may be increased. Although the above embodiments have been described in the context of SLMs for patterning projection beams in lithographic projection apparatus, it will be appreciated that the present invention is not limited to this use and may be used to create SLMs for other uses.

Whilst specific embodiments of the invention have been described above, it will be appreciated that the invention as claimed may be practiced otherwise than as described. For example, although use of a lithography apparatus to expose a resist on a substrate is herein described, it will be appreciated that the invention is not limited to this use, and an apparatus according to an embodiment of the invention may be used to project a patterned projection beam for use in resistless lithography. Thus, it is explicitly noted that the description of these embodiments is not intended to limit the invention as claimed.

The invention claimed is:

1. A lithographic projection apparatus comprising:
   a radiation system configured to provide a beam of radiation;
   a programmable patterning structure configured to pattern the beam according to a desired pattern;
   a projection system configured to project the patterned beam onto a target portion of a substrate;
   wherein said programmable patterning structure comprises a plurality of individually addressable pixel elements, wherein at least one of the pixel elements comprises:
   a first layer of solid state electro-optical material having a birefringence that varies according to an applied voltage; and
   a plurality of electrodes configured to apply a voltage to the layer sufficient to vary a birefringence of the electro-optical material,
   wherein each pixel element is selectively configurable to modulate both of an amplitude and a phase of radiation that is incident on the pixel element.

2. The lithographic projection apparatus according to claim 1, further comprising a layer of reflective material configured to reflect radiation transmitted through the layer of electro-optical material.

3. The lithographic projection apparatus according to claim 1, wherein the layer of electro-optical material is formed from at least one of ammonium dihydrogen phosphate, deuterated ammonium dihydrogen phosphate, potassium dihydrogen phosphate, and deuterated potassium dihydrogen phosphate.

4. The lithographic projection apparatus according to claim 1, wherein said at least one pixel element further comprises:
   a second layer of electro-optical material; and
   at least one electrode configured to apply a second voltage to said second layer sufficient to vary the birefringence of the electro-optical material of said second layer,
   wherein an extraordinary axis of said second layer is perpendicular to an extraordinary axis of the first layer.

5. The lithographic projection apparatus according to claim 4 wherein the layer of electro-optical material is formed from one of ammonium dihydrogen phosphate, deuterated ammonium dihydrogen phosphate, potassium dihydrogen phosphate, and deuterated potassium dihydrogen phosphate.

6. The lithographic projection apparatus according to claim 4 further comprising a layer of reflective material configured to reflect radiation transmitted through the layer of electro-optical material.

7. The lithographic projection apparatus according to claim 1, wherein said at least one pixel element further comprises an actuator configured to adjust a position of the layer of electro-optical material in at least a direction parallel to a beam of radiation incident on the pixel element.

8. The lithographic projection apparatus according to claim 7, further comprising a layer of reflective material configured to reflect radiation transmitted through the layer of electro-optical material.

9. The lithographic projection apparatus according to claim 7, wherein the layer of electro-optical material is formed from one of ammonium dihydrogen phosphate, deuterated ammonium dihydrogen phosphate, potassium dihydrogen phosphate, and deuterated potassium dihydrogen phosphate.

10. The lithographic projection apparatus according to claim 1, said apparatus further comprising a polarizing filter configured to attenuate radiation outgoing from at least one of the pixel elements, based on a polarization of the outgoing radiation.

11. The lithographic projection apparatus according to claim 1, further comprising a cooling unit configured to control a temperature of the layer of electro-optical material to be above and substantially close to a Curie temperature of the layer.

12. A programmable patterning structure comprising a plurality of individually addressable pixel elements, wherein at least one of the pixel elements comprises:
   a first layer of solid state electro-optical material having a birefringence that varies according to an applied voltage; and
   a plurality of electrodes configured to apply a voltage to the layer sufficient to vary the birefringence of the electro-optical material,
   wherein each pixel element is selectively configurable to modulate both an amplitude and a phase of radiation that is incident on the pixel element.

13. The programmable patterning structure according to claim 12, further comprising a layer of reflective material configured to reflect radiation transmitted through the layer of electro-optical material.

14. The programmable patterning structure according to claim 12, wherein the layer of electro-optical material is formed from at least one of ammonium dihydrogen phosphate, deuterated ammonium dihydrogen phosphate, potassium dihydrogen phosphate, and deuterated potassium dihydrogen phosphate.

15. The programmable patterning structure according to claim 12, wherein said at least one pixel element further comprises:
   a second layer of electro-optical material; and
   at least one electrode configured to apply a second voltage to said second layer sufficient to vary a birefringence of the electro-optical material of said second layer,
   wherein an extraordinary axis of said second layer is perpendicular to an extraordinary axis of the first layer.

16. The programmable patterning structure according to claim 12, wherein said at least one pixel element further comprises an actuator configured to adjust a position of the layer of electro-optical material in at least a direction parallel to a beam of radiation incident on the pixel element.

17. The programmable patterning structure according to claim 12, said apparatus further comprising a polarizing filter configured to attenuate radiation outgoing from at least one of the pixel elements, based on a polarization of the outgoing radiation.

18. A device manufacturing method comprising:
   providing a beam of radiation;
   using a programmable patterning structure to pattern the beam according to a desired pattern; and
   projecting the patterned beam onto a target portion of a substrate,
   wherein the programmable patterning structure comprises a plurality of individually addressable pixel elements, wherein at least one of the pixel elements comprises:
   a first layer of solid state electro-optical material having a birefringence that varies according to an applied voltage; and
   a plurality of electrodes configured to apply a voltage to the layer sufficient to vary the birefringence of the electro-optical material, wherein each pixel element is selectively configurable to modulate both an amplitude and a phase of radiation that is incident on the pixel element.

19. The device manufacturing method according to claim 18, wherein said at least one pixel element further comprises:
a second layer of electro-optical material; and
at least one electrode configured to apply a second voltage to said second layer sufficient to vary the birefringence of the electro-optical material of said second layer,
wherein an extraordinary axis of said second layer is perpendicular to an extraordinary axis of the first layer.

20. The device manufacturing method according to claim 18, said method further comprising adjusting a position of the layer of electro-optical material in at least a direction parallel to a beam of radiation incident on the pixel element.

21. The device manufacturing method according to claim 18, said method further comprising attenuating radiation outgoing from at least one of the pixel elements, based on a polarization of the outgoing radiation.

22. The device manufacturing method according to claim 18, further comprising controlling a temperature of the layer of electro-optical material to be above and substantially close to a Curie temperature of the layer.

23. A device manufacturing method comprising:
providing a beam of radiation;
patterning the beam; and
projecting the patterned beam onto a target portion of a substrate,
wherein said patterning includes selectably configuring at least one of a plurality of pixel elements, and
wherein said selectably configuring includes applying a voltage sufficient to vary a birefringence of a first layer of solid state electro-optical material of the at least one pixel element, and
wherein said selectably configuring further includes modulating both an amplitude and a phase of radiation that is incident on the at least one pixel element.

24. The device manufacturing method according to claim 23, wherein said selectably configuring further includes applying a second voltage sufficient to vary a birefringence of a second layer of electro-optical material of the at least one pixel element.

25. The device manufacturing method according to claim 24, wherein an extraordinary axis of said second layer is perpendicular to an extraordinary axis of the first layer.

26. The device manufacturing method according to claim 23, said method further comprising adjusting a position of the layer of electro-optical material in at least a direction parallel to a beam of radiation incident on the pixel element.

27. The device manufacturing method according to claim 23, said method further comprising attenuating radiation outgoing from at least one of the pixel elements, based on a polarization of the outgoing radiation.

28. The device manufacturing method according to claim 23, further comprising controlling a temperature of the layer of electro-optical material to be above and substantially close to a Curie temperature of the layer.

* * * * *